(12) United States Patent
Shiozaki et al.

(10) Patent No.: US 8,048,772 B2
(45) Date of Patent: Nov. 1, 2011

(54) SUBSTRATE BONDING METHOD AND ELECTRONIC COMPONENT THEREOF

(75) Inventors: Masayoshi Shiozaki, Nara (JP); Makoto Moriguchi, Nara (JP)

(73) Assignee: OMRON Corporation, Kyoto (JP)

( * ) Notice: Subject to any disclaimer, the term of this patent is extended or adjusted under 35 U.S.C. 154(b) by 59 days.

(21) Appl. No.: 12/502,735

(22) Filed: Jul. 14, 2009

(65) Prior Publication Data

US 2010/0006999 A1 Jan. 14, 2010

(30) Foreign Application Priority Data

Jul. 14, 2008 (JP) .................... 2008-182577

(51) Int. Cl.
*H01L 21/30* (2006.01)
*H01L 21/46* (2006.01)
(52) U.S. Cl. ................ 438/458; 438/455; 257/E21.211
(58) Field of Classification Search .............. 438/458, 438/460, 479, 463, 455; 257/E21.211, E21.57, 257/E21.568, E29.005, 506, 434, 797
See application file for complete search history.

(56) References Cited

U.S. PATENT DOCUMENTS

2006/0237810 A1* 10/2006 Sand et al. .................. 438/458
2008/0311726 A1* 12/2008 Ohnuma et al. ............. 438/455
2010/0015782 A1* 1/2010 Yu et al. ..................... 438/463

FOREIGN PATENT DOCUMENTS

| CN | 1582072 A | 2/2005 |
|---|---|---|
| CN | 101023517 A | 8/2007 |
| JP | 2004-160607 A | 6/2004 |
| JP | 2007-509578 A | 4/2007 |
| JP | 2007-184546 A | 7/2007 |
| WO | 2006/029651 A1 | 3/2006 |

OTHER PUBLICATIONS

Patent Abstracts of Japan, Publication No. 2007-184546, Publication Date: Jul. 19, 2007, 1 page.
Patent Abstracts of Japan, Publication No. 2004-160607, Publication Date: Jun. 10, 2004, 1 page.
English abstract of CN1582072A published on Feb. 16, 2005, 1 page.
English abstract of CN101023517A published on Aug. 22, 2007, 1 page.
Chinese Office Action issued in Chinese Application No. 200910159981.X issued on Apr. 28, 2011 and English translation thereof, 11 pages.

* cited by examiner

*Primary Examiner* — Walter L Lindsay, Jr.
(74) *Attorney, Agent, or Firm* — Osha • Liang LLP

(57) ABSTRACT

A substrate bonding method has a film forming step of forming an insulating film for bonding in such a manner that an $SiO_2$ film made of TEOS is deposited on at least one of a first substrate and a second substrate by a CVD method, and a bonding step of bonding the first substrate and the second substrate with the insulating film for bonding being interposed between the first substrate and the second substrate.

6 Claims, 13 Drawing Sheets

SUBSTRATE BONDING METHOD AND ELECTRONIC COMPONENT THEREOF

BACKGROUND OF THE INVENTION

1. Technical Field

The present invention relates to a substrate bonding method and an electronic component. More specifically, the invention relates to a substrate bonding method for layering a first substrate and a second substrate preferably comprising at least one device, preferably a MEMS device, provided thereon. More specifically, the invention relates to a substrate bonding method for layering a substrate having a device provided thereon, preferably an IC device, and a substrate having a device provided thereon, preferably a MEMS device. In particular, the invention concerns a substrate bonding method for performing wafer level packaging on wafer substrates layered vertically as they are after assembling.

2. Related Art

In a step of manufacturing a MEMS (Micro Electro-Mechanical System), typically, a wafer having a plurality of MEMS devices provided thereon is diced into a plurality of chips, each chip (i.e., each MEMS device) is incorporated in a package housing, and an opening of the package housing is sealed with a cover.

In such a manufacturing method, however, each MEMS device is subjected to packaging using a package housing and a cover, resulting in complication of the step of manufacturing the MEMS. In course of the manufacture of the MEMS, further, dust and dirt are attached to the MEMS device, resulting in reduction of yields. Moreover, restriction to the package housing hinders miniaturization of the MEMS device.

In order to solve these problems, attention has been given to a wafer level bonding technique for packaging a MEMS device and the like in a state of a wafer, or a technique called wafer level packaging. According to this method, wafers each having a plurality of devices provided thereon, for example, a wafer having a plurality of IC devices such as CMOS provided thereon and a wafer having a plurality of MEMS devices provided thereon are layered (superimposed) vertically and then are bonded. Thus, each MEMS device and each IC device are confined in a pair within a cell formed between the wafers. Thereafter, the bonded wafers are separated into cells by dicing or the like to obtain a MEMS having a configuration that the MEMS device and the IC device are accommodated in the package formed by the wafers.

According to this manufacturing method, since the wafers are cut with the MEMS device and the IC device being confined therebetween, dust and dirt are less prone to be attached to the MEMS device and the like. Moreover, the MEMS device having a movable part is not handled in a bare chip state, leading to enhancement of yields of MEMSs. Further, the resultant MEMS is reduced in size and the number of MEMSs to be obtained from one wafer increases, leading to reduction of manufacturing costs.

However, there remain the following problems to be solved in order to put such a wafer level bonding technique to practical use.

In a case of vertically layering a wafer having an IC device such as CMOS provided thereon and a wafer having a MEMS device provided thereon and performing wafer level bonding (i.e., packaging) on the layered wafers, it is necessary to achieve electrical insulation and electrical conduction simultaneously between the vertically layered wafers. For example, bonding surfaces of the wafers must be electrically insulated whereas electrodes of the respective devices must be electrically connected. For this reason, the wafers are bonded with an insulating film being interposed therebetween (e.g., refer to JP 2007-184546 A). Herein, the insulating film on the bonding surface requires satisfactory smoothness in order to increase bonding strength between the wafers and to ensure reliability. Moreover, the insulating film also requires satisfactory smoothness in order to ensure hermeticity and sealability between the wafers.

An $SiO_2$ film is a typical insulating film for use in a bonding surface (e.g., refer to JP 2007-184546 A). Examples of a method for forming such an $SiO_2$ film include a film forming method using thermal oxidation (e.g., refer to JP 2004-160607 A) and a film forming method using PVD (Physical Vapor Deposition) such as sputtering (e.g., refer to JP 2007-509578 A).

According to the thermal oxidation method for thermally oxidizing a surface of an Si wafer to form an insulating film (i.e., an $SiO_2$ film), this formed $SiO_2$ film has satisfactory surface smoothness and thickness evenness. However, the thermal oxidation method is a high-temperature process of applying heat at about 1000° C. to a wafer in an oxygen atmosphere in order to form a film. Consequently, the heat causes damage on a wiring pattern formed on the wafer, resulting in breaks of the wiring pattern.

According to the PVD method such as sputtering, on the other hand, an $SiO_2$ film can be formed by a process at a low temperature of about 100° C. As a result, a wiring pattern on a wafer is prevented from being damaged thermally. According to the PVD method, however, the formed $SiO_2$ film is unsatisfactory in surface smoothness and thickness evenness. Consequently, there is a problem that it is impossible to satisfactorily increase bonding strength between the $SiO_2$ film and the wafer and to satisfactorily ensure reliability.

In order to attain smoothness, a bonding surface is occasionally subjected to CMP (Chemical Mechanical Polishing) in manufacture of LSI and the like. However, a MEMS device has such a complicated structure that structural components, electrodes and the like are formed on both sides of a wafer. For this reason, there is a possibility that the polishing causes damage on the MEMS device. Consequently, it is impossible to attain the smoothness by the polishing, that is, it is impossible to smooth the $SiO_2$ film formed by the PVD method, by the polishing.

SUMMARY

One or more embodiments of the present invention provides a substrate bonding method capable of forming a smooth $SiO_2$ film by a process at a relatively low temperature and capable of reliably bonding substrates with the smooth $SiO_2$ film being interposed between the substrates.

A substrate bonding method according to one or more embodiments of the present invention includes: a film forming step of forming an insulating film for bonding in such a manner that an $SiO_2$ film made of TEOS is deposited on at least one of a first substrate and a second substrate by a CVD method; and a bonding step of bonding the first substrate and the second substrate with the insulating film for bonding being interposed between the first substrate and the second substrate.

In the substrate bonding method according to one or more embodiments of the present invention, an insulating film for bonding is formed by deposition of an $SiO_2$ film made of TEOS. The insulating film (i.e., the TEOS-$SiO_2$ film) formed as described above is excellent in surface smoothness and thickness evenness. Thus, the insulating film for bonding, which is formed on one of two substrates, is brought into surface contact with the other substrate, so that the substrates can be bonded firmly in a state that an insulating property between the substrates is ensured. Moreover, the insulating film for bonding is excellent in surface smoothness and thickness evenness and, therefore, requires no polishing after being formed unlike an insulating film formed by sputtering. As a result, there is no possibility that the polishing causes damage on a device, leading to facilitation of a process carried out prior to bonding of substrates and improvement of a degree of freedom concerning the process. In a method of forming an $SiO_2$ film made of TEOS by a CVD method, moreover, the $TEOS-SiO_2$ film can be formed at a temperature of about not more than 500° C. by use of a film forming device operable at a relatively low temperature. As a result, there is no possibility that an Al wiring pattern is melted and damaged, leading to enhancement of yields of finished products and improvement of reliability.

Examples of a manner of bonding first and second substrates with an insulating film for bonding being interposed between the first and second substrates include a case where an insulating film for bonding formed on a first substrate is bonded to a surface of a second substrate, and a case where an insulating film for bonding formed on a first substrate is bonded to an insulating film for bonding formed on a second substrate.

In accordance with one aspect of the present invention, an electrode for bonding made of a plastically deformable metal is formed on one of an electrode of the first substrate and an electrode of the second substrate, and in the bonding step, the first and second substrates are layered and bonded in such a manner that the electrode for bonding is abutted against the electrode of the substrate on which the electrode for bonding is not formed, before the insulating film for bonding is abutted against a surface of the substrate on which the insulating film for bonding is not formed, and then is press-fitted to the electrode of the substrate on which the electrode for bonding is not formed. Herein, the plastically deformable metal refers to a metal which is lower in hardness than the substrate, and examples thereof include Au, Al, Cu, Ag and the like. According to this aspect, the substrates can be bonded while being electrically insulated by the insulating film for bonding and, simultaneously, the electrodes of the substrates can be bonded while being electrically connected by the electrode for bonding.

In accordance with another aspect of the present invention, in the bonding step, the first substrate and the second substrate are bonded with the insulating film for bonding being interposed therebetween by a bonding method for activating a bonding surface. Herein, the bonding method for activating the bonding surface refers to a method for activating bonding surfaces by use of an ion gun or plasma and then bonding the bonding surfaces, and examples thereof include direct bonding, plasma bonding and the like. According to this aspect, the substrates can be bonded at a relatively low temperature (more preferably, a normal temperature). In this joining, therefore, there is no possibility that a wiring pattern and the like of a device are damaged. Moreover, a product is not necessarily cooled after the bonding, leading to enhancement of productivity.

In accordance with still another aspect of the present invention, the first substrate is a wafer substrate, the second substrate is a wafer substrate having a plurality of devices provided thereon, and the first substrate and the second substrate are bonded and then are cut for each region where the device is provided. According to this aspect, the wafer substrates are bonded and then are cut for each device in order to prepare a product. Therefore, the device can be handled in a wafer state until a final stage for preparation of a product, leading to enhancement of yields of products. Herein, the bonded wafer substrates may be cut at a position between the adjacent insulating films for bonding. In such a cutting method, a load is less prone to be placed on the insulating film for bonding. Moreover, the bonded wafer substrates may be cut at a position where the insulating film for bonding is divided. According to such a cutting method, a film formation pattern of the insulating film for bonding can be facilitated.

In accordance with yet another aspect of the present invention, the number of substrates to be bonded is not less than three. The method for bonding two substrates is applied to the respective substrates, so that at least three substrates can be layered and integrated.

An electronic component according to one or more embodiments of the present invention includes: a first substrate; a second substrate having a device provided thereon; and an insulating film for bonding formed on at least one of the first and second substrates, the insulating film being an $SiO_2$ film made of TEOS. Herein, the device is sealed between the first and second substrates in such a manner that the first and second substrates are bonded with the insulating film for bonding being interposed therebetween.

In the electronic component according to one or more embodiments of the present invention, an insulating film for bonding is formed by deposition of an $SiO_2$ film made of TEOS. The insulating film (i.e., the $TEOS-SiO_2$ film) formed as described above is excellent in surface smoothness and thickness evenness. Thus, the insulating film for bonding, which is formed on one of two substrates, is brought into surface contact with the other substrate, so that the substrates can be bonded firmly. Moreover, the insulating film for bonding is excellent in surface smoothness and thickness evenness and, therefore, requires no polishing after being formed unlike an insulating film formed by sputtering. As a result, there is no possibility that the polishing causes damage on a device, leading to facilitation of a process for bonding substrates. In a method of forming an $SiO_2$ film made of TEOS, moreover, a film forming device operable at a relatively low temperature can be used. As a result, a wiring pattern and the like on a device are less prone to be damaged.

One or more embodiments of the present invention has features based on appropriate combinations of the constituent elements described above. Thus, the present invention allows numerous variations based on the combinations of the constituent elements.

DETAILED DESCRIPTION

With reference to the accompanying drawings, hereinafter, description will be given of preferred embodiments of the present invention.

Figure 1:
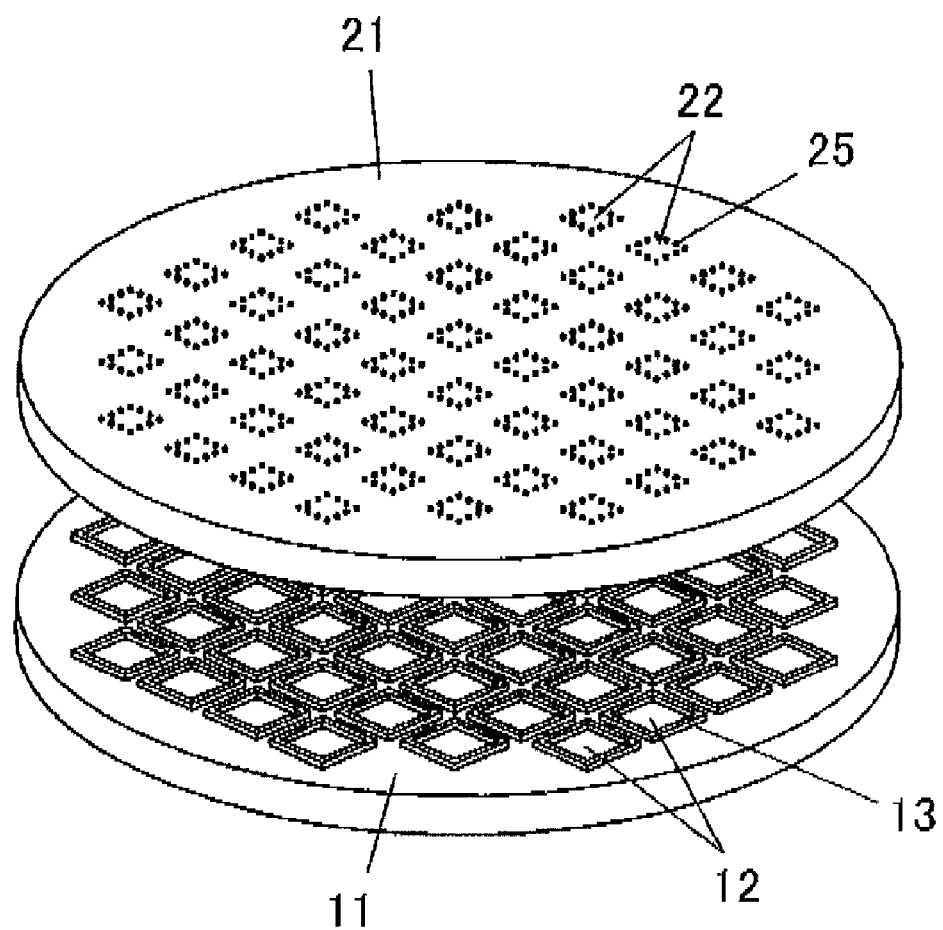
FIG. 1 shows a perspective view of a manner of wafer level bonding according to one embodiment of the present invention and, more specifically, shows a manner of bonding a wafer having a MEMS device provided thereon and a wafer having an IC device provided thereon.

With reference to the drawings, first, description will be given of one embodiment of the present invention. FIG. 1 shows two wafers which are layered vertically and then are subjected to wafer level bonding. Each wafer has a plurality of minute devices provided thereon using a MEMS manufacturing technique or a semiconductor manufacturing technique. The devices to be provided on the two wafers may be a combination of any devices, for example, a combination of a MEMS device such as a sensor or a transducer and an IC device such as an IC, an LSI or an ASIC, a combination of an IC device and an IC device, or a combination of a MEMS device and a MEMS device. Moreover, one of the two wafers may be simply a wafer for sealing having no device. In the following, description will be given of the combination mentioned first, that is, the case where one of the wafers has a plurality of MEMS devices provided thereon and the other wafer has a plurality of IC devices provided thereon.

As shown in FIG. 1, a wafer 11 (an Si wafer) has a plurality of IC devices 12 provided thereon with regular pitches, and each IC device 12 is surrounded with an insulating seal 13 (an insulating film for bonding) which is a TEOS-SiO₂ film. On the other hand, a wafer 21 (an Si wafer) has a plurality of MEMS devices 22 provided thereon with regular pitches in correspondence with the IC devices 12.

Figure 2:
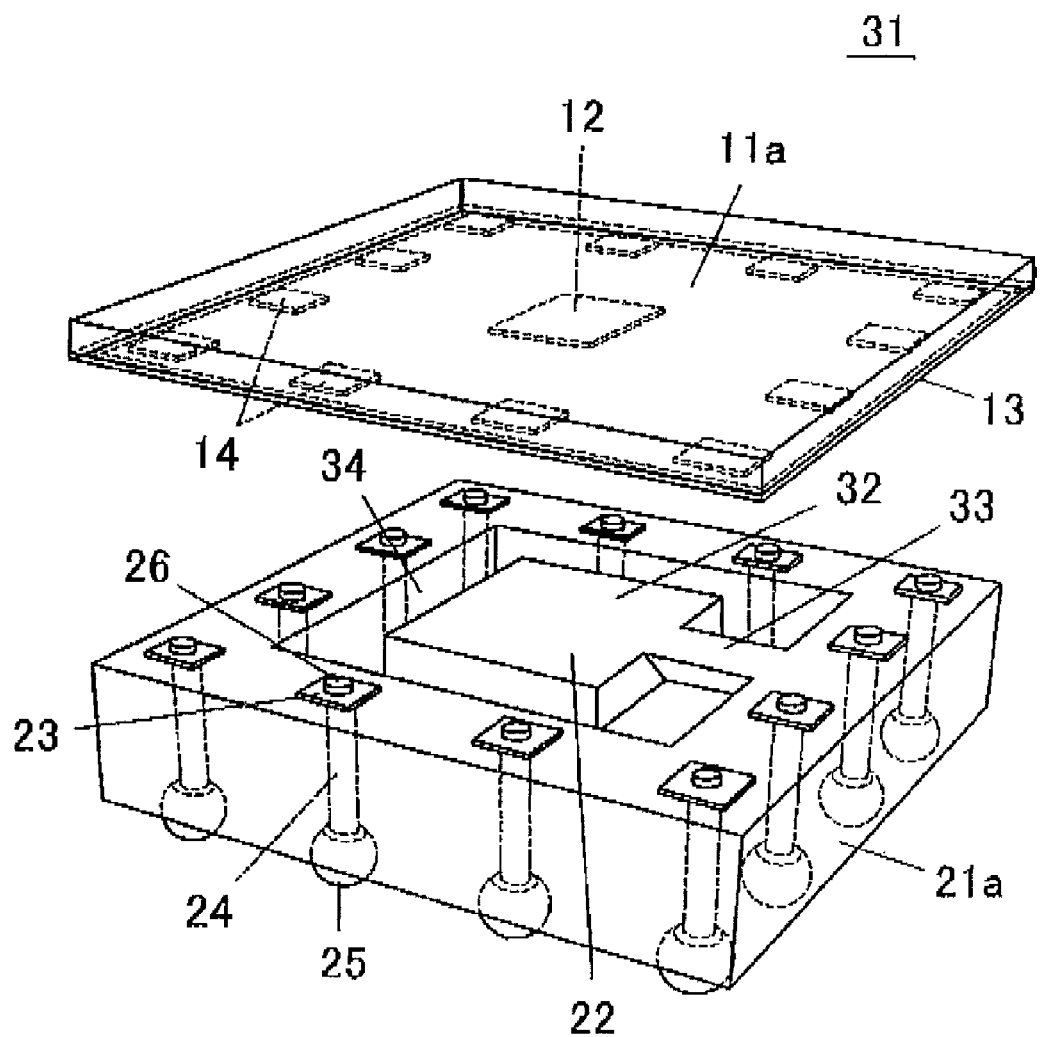
FIG. 2 shows an exploded perspective view of a MEMS obtained from the bonded wafers shown in FIG. 1 by dicing.

FIG. 2 shows an exploded perspective view of a MEMS 31 obtained in such a manner that the wafer 11 and the wafer 12 are layered vertically, are integrated by bonding, and are cut by dicing. The MEMS device 22 is located on a substrate 21a which is part of the wafer 21. In FIG. 2, the MEMS device 22 is shown as a uniaxial acceleration sensor in which a weight 32 located inside a recess 34 of the substrate 21a is supported by a cantilever 33. The weight 32 is displaced vertically by sensing an acceleration, and this displacement is measured by an electrostatic capacitance method or a piezoelectric resistance method. Herein, measurement signals can be partly output to an electrode 23.

The IC device 12 is located on a cover substrate 11a which is part of the wafer 11, and processes the measurement signals from the MEMS device 22. The cover substrate 11a has an inner peripheral portion surrounded with the insulating seal 13 in a frame shape.

A plurality of electrodes 14 are formed on a periphery of a bottom surface of the cover substrate 11a and are electrically connected to the IC device 12. On the other hand, a plurality of electrodes 23 are formed on a periphery of a top surface of the substrate 21a. Herein, each of the electrodes 14 and 23 is formed in such a manner that a surface of a Cr electrode film is subjected to Au plating. A position of each electrode 14 corresponds to a position of each electrode 23. Each electrode 23 is electrically connected to a bump 25 formed on a bottom surface of the substrate 21a through a via hole 24 which penetrates through the substrate 21a.

Moreover, a protruding electrode 26 (an electrode for bonding) made of Au is formed on each electrode 23. The electrode 23 is electrically connected to the electrode 14 in such a manner that the Au protruding electrode 26 is press-fitted to the electrode 14. Therefore, the electrode 14 of the cover substrate 11a is also electrically connected to the bump 25 formed on the bottom surface of the substrate 21a. Herein, the material for the protruding electrode 26 may preferably be a metal having a hardness which is lower than that of Si, that is, 6.5 GPa, and examples thereof may include Al, Cu, Ag and the like in addition to Au.

Thus, the insulating seal 13 formed on the cover substrate 11a is bonded to the top surface of the substrate 21a by a bonding method such as direct bonding or plasma bonding for activating a bonding surface as the insulating seal 13 in the wafer state shown in FIG. 1, so that the cover substrate 11a and the substrate 21a are integrated.

In the MEMS 31 connected to a circuit board through the bump, moreover, electric power is supplied to the IC device 12 by a route passing through any bump 25, the corresponding via hole 24, the corresponding electrode 23, the corresponding Au protruding electrode 26 and the corresponding electrode 14. Further, the measurement signals are sent from the MEMS device 22 to the IC device 12 by a route passing through any electrode 23, the corresponding Au protruding electrode 26 and the corresponding electrode 14. The signals subjected to signal processing in the IC device 12 are output to the outside by a route passing through any electrode 14, the corresponding Au protruding electrode 26, the corresponding electrode 23, the corresponding via hole 24 and the corresponding bump 25.

Figure 5:
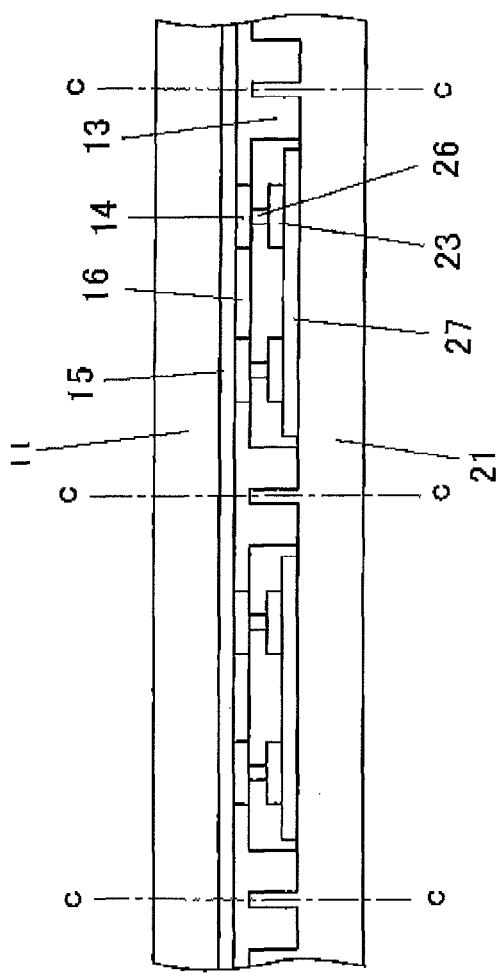
FIG. 5 shows a schematic sectional view of a state that the wafer having the Au protruding electrode formed thereon and the wafer having the insulating seal formed thereon are layered vertically and then are integrated by bonding.
Figure 6:
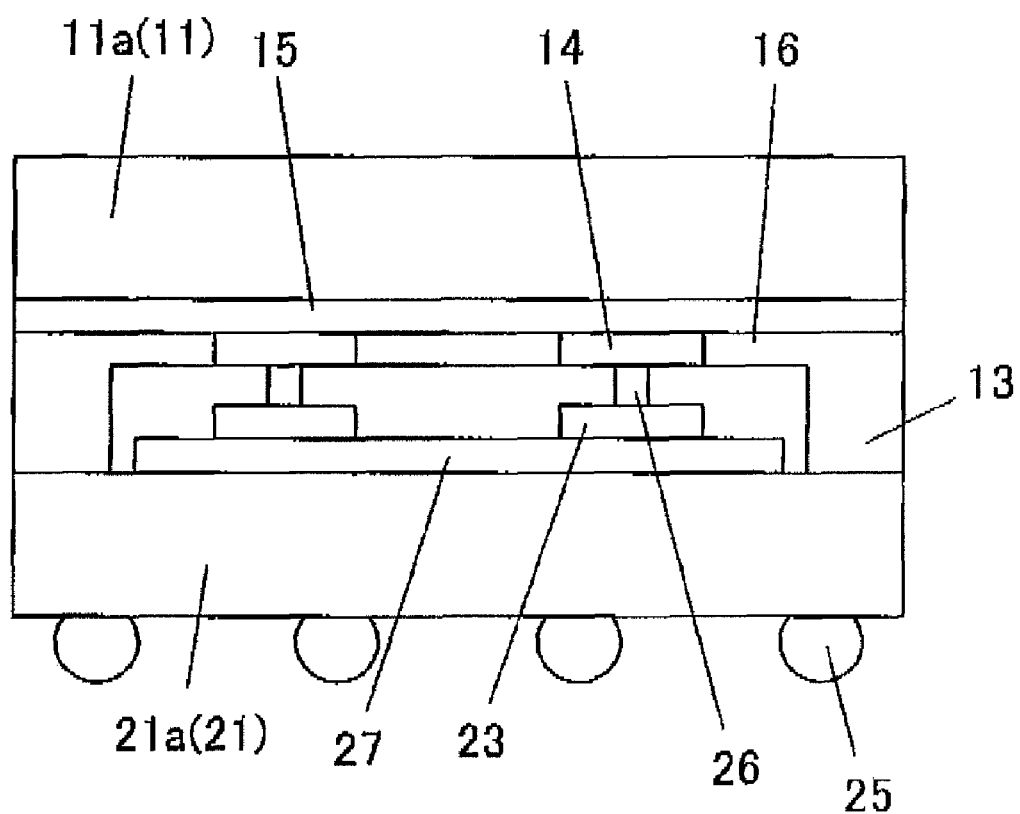
FIG. 6 shows a schematic sectional view of the MEMS obtained from the vertically layered wafers by dicing.

With reference to FIGS. 3A to 3D through FIG. 6, next, detailed description will be given of steps to be carried out for obtaining the MEMS 31 shown in FIG. 2 from the wafer state shown in FIG. 1. FIGS. 3A to 3D show schematic sectional views of steps to be carried out for forming the Au protruding electrode 26 on the wafer 21. FIGS. 4A to 4D show schematic sectional views of steps to be carried out for forming the insulating seal 13 on the wafer 11. FIG. 5 shows a schematic sectional view of the state that the wafer 21 having the Au protruding electrode 26 formed thereon and the wafer 11 having the insulating seal 13 formed thereon are layered vertically and then are integrated by bonding. FIG. 6 shows a schematic sectional view of the MEMS 31 obtained from the vertically layered wafers 11 and 12 by dicing.

Figure 3A:
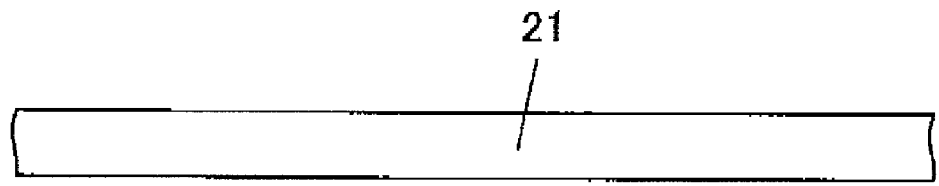
FIGS. 3A to 3D show schematic sectional views of steps to be carried out for forming an Au protruding electrode on one of the wafers.
Figure 3B:
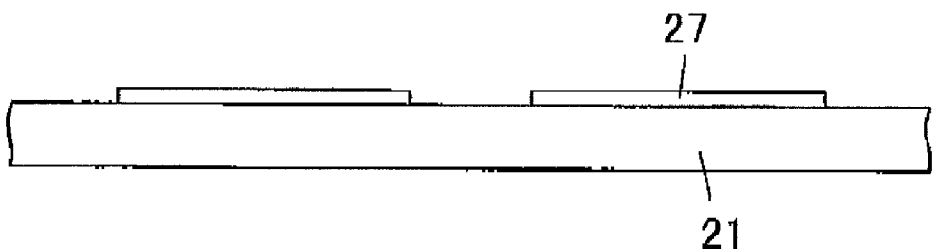
Figure 3C:
Figure 3D:
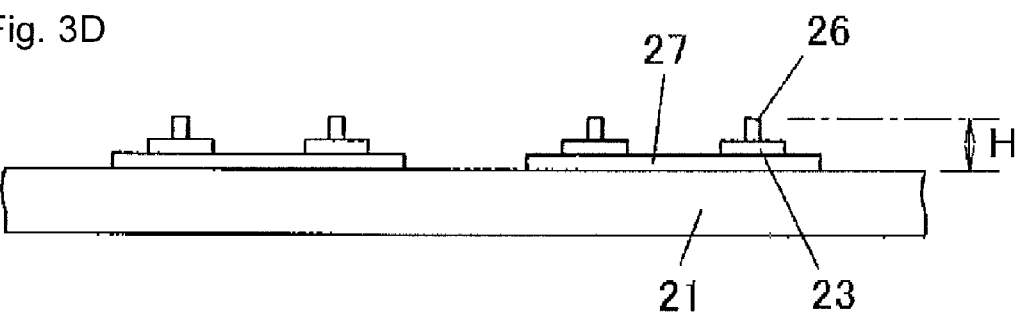

As shown in FIG. 3A, a wafer 21 is obtained in such a manner that a plurality of MEMS devices 22 are provided on an Si wafer by use of a MEMS manufacturing technique and a plurality of via holes 24 are formed at required positions on the Si wafer. As shown in FIG. 3B, next, the wafer 21 is washed and then a TEOS-SiO₂ film is formed on a top surface of the wafer 21 by a CVD (Chemical Vapor Deposition) method, so that a substrate insulating film 27 is formed on the top surface of the wafer 21. Herein, a region serving as a surface to be bonded to a wafer 11 (i.e., a periphery of each MEMS device 22) is masked for preventing the substrate insulating film 27 from being formed thereon such that the surface of the wafer 21 is bared. As shown in FIG. 3C, next, a plurality of electrodes 23 each having a two-layer structure consisting of a lower Cr layer and an upper Au layer are formed at predetermined positions on the substrate insulating film 27. As shown in FIG. 3D, next, an Au protruding electrode 26 is formed on each electrode 23.

Figure 4A:
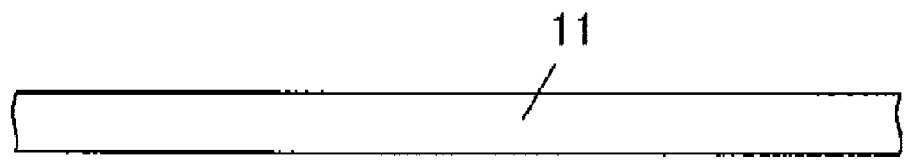
FIGS. 4A to 4D show schematic sectional views of steps to be carried out for forming an insulating seal on the other wafer.
Figure 4B:
Figure 4C:
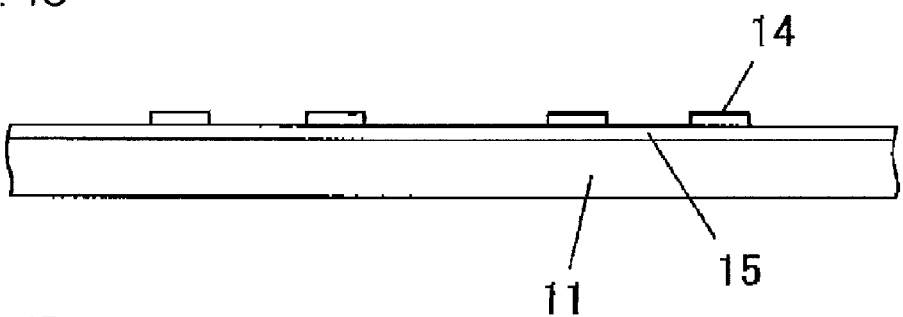
Figure 4D:
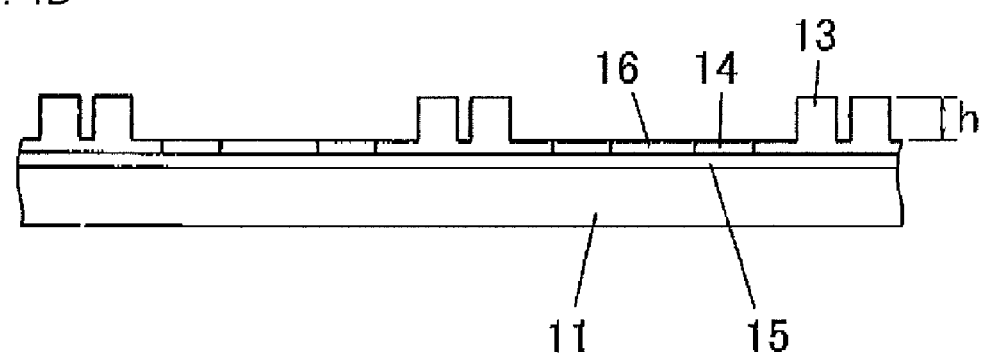

As shown in FIG. 4A, the wafer 11 is obtained in such a manner that a plurality of IC devices 12 are provided on an Si wafer by a semiconductor manufacturing process. As shown in FIG. 4B, next, the wafer 11 is washed and then a TEOS-SiO$_2$ film is formed on a top surface of the wafer 11 by a CVD method, so that a lower-layer insulating film 15 is formed on the entire top surface of the wafer 11. As shown in FIG. 4C, next, a plurality of electrodes 14 each having a two-layer structure consisting of a lower Cr layer and an upper Au layer are formed at predetermined positions on the lower-layer insulating film 15. As shown in FIG. 4D, next, a TEOS-SiO$_2$ film is formed on the lower-layer insulating film 15 by the CVD method in order to form an upper-layer insulating film 16. Furthermore, a TEOS-SiO$_2$ film is formed by the CVD method in order to form an insulating seal 13 on a region serving as a surface to be bonded to the wafer 21. Herein, each IC device 12 is surrounded with the insulating seal 13. Moreover, the electrode 14 is bared from the upper-layer insulating film 16. The insulating seal 13 has a thickness which is considerably larger than that of the upper-layer insulating film 16. A total thickness H of the substrate insulating film 27, the electrode 23 and the Au protruding electrode 26 is larger than a height h of the insulating seal 13 which is measured from a surface of the electrode 14 to a top surface of the insulating seal 13.

The IC device wafer 11 and the MEMS device wafer 21 are ready for bonding as described above, and then are washed with an organic solvent or an acid. As shown in FIG. 5, next, the wafer 11 is turned upside down and is superimposed on the wafer 21 such that the insulating seal 13 of the wafer 11 is opposed to the bonding surface of the wafer 21 and the Au protruding electrode 26 of the wafer 21 is opposed to the electrode 14 of the wafer 11. Herein, the total thickness H of the substrate insulating film 27, the electrode 23 and the Au protruding electrode 26 is larger than the height h of the insulating seal 13 which is measured from the surface of the electrode 14 to the top surface of the insulating seal 13. Therefore, when the wafers 11 and 21 are superimposed, the Au protruding electrode 26 is abutted against the electrode 14 of the wafer 11. The Au protruding electrode 26 is soft and, when the wafer 11 is pressed against the wafer 21 until the insulating seal 13 is abutted against the surface of the wafer 21, the Au protruding electrode 26 is crushed and press-fitted to the electrode 14, so that the electrode 14 is electrically connected to the electrode 23. Next, the insulating seal 13 as the TEOS-SiO$_2$ film is bonded to the surface of the wafer 21 by direct bonding or plasma bonding such that the wafers 11 and 21 are integrated. This bonding ensures the electrical connection and, simultaneously, provides complete blockage of external atmosphere because of the complete sealing using the insulating seal 13.

Next, a plurality of bumps 25 are formed on a back surface of the wafer 21, and then the wafers 11 and 21, which are layered vertically, are cut with a dicing blade or the like at a position between the adjacent insulating seals 13 (along a line c-c in FIG. 5). As shown in FIG. 6, thus, there is obtained a MEMS 31 in which the MEMS device 22 and the IC device 12 are sealed with the package formed by a substrate 21a and a cover substrate 11a. In FIG. 5, the wafers 11 and 21 are cut at the position between the adjacent insulating seals 13. Alternatively, a width of the insulating seal 13 may be made sufficiently larger than a thickness of the dicing blade such that the wafer 11 and 21 can be cut at a position where the insulating seal 13 is divided.

The TEOS-SiO$_2$ film described in the manufacturing process is made of TEOS, that is, "tetraethoxysilane" Si(OC$_2$H$_5$)$_4$. Herein, SiO$_2$ generated from TEOS is deposited on a film formation surface, and a CVD method is employed for generating SiO$_2$ from TEOS.

Figure 7:
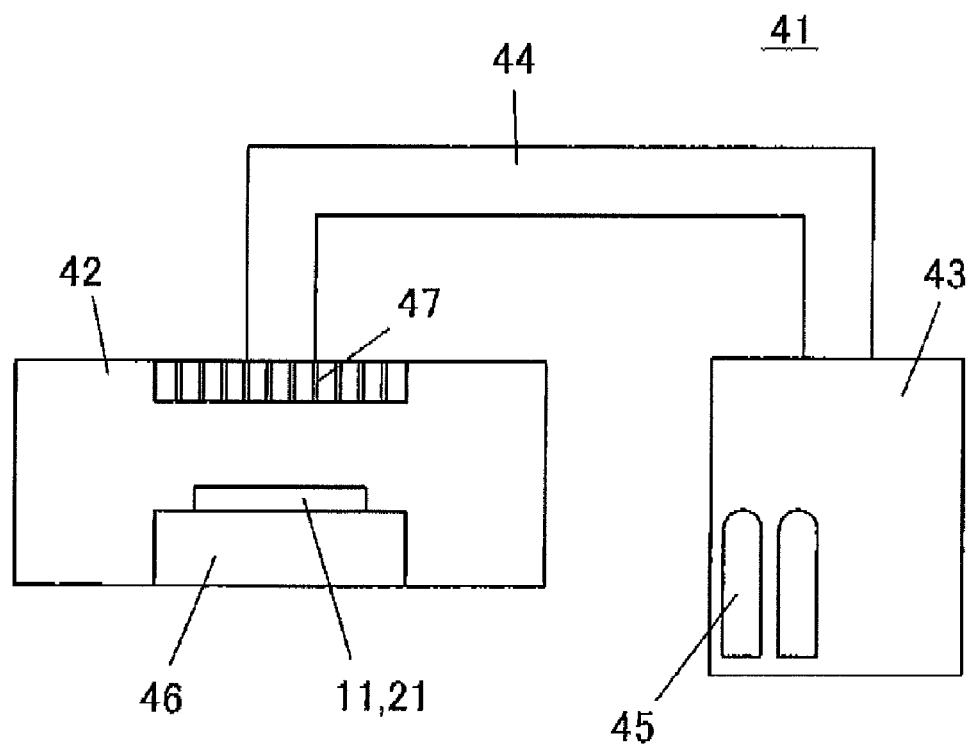
FIG. 7 shows a schematic view for describing a configuration of a CVD device for forming a TEOS-SiO₂ film.

FIG. 7 shows a plasma CVD device 41 for forming a TEOS-SiO$_2$ film. The plasma CVD device 41 includes a chamber 42 for film formation, a raw material container 43, and a supply duct 44 for coupling the chamber 42 to the raw material container 43. The raw material container 43 retains liquid TEOS which is supplied from a TEOS tank 45. The raw material container 43 is kept at a temperature of about 50° C., and vaporized TEOS in the raw material container 43 is supplied into the chamber 42 through the supply duct 44.

The chamber 42 is kept at a low pressure of 1 to 10 Torr, and the wafer 11 or 21 is placed on a table 46. The wafer 11 or 21 on the table 46 is heated with a heater or the like and is kept at a substrate temperature of 200° C. to 500° C. (preferably, about 300° C.).

The vaporized TEOS supplied from the supply duct 44 is ejected from a shower head 47 in the chamber 42. The TEOS ejected from the shower head 47 is decomposed by energy of plasma discharge (i.e., bonds other than an Si—O bond are disengaged) to generate SiO$_2$ molecules. The SiO$_2$ molecules are deposited on the wafer 11 or 21, so that a TEOS-SiO$_2$ film is formed on the wafer 11 or 21.

The foregoing film formation conditions and other film formation conditions are summarized as follows.

Figure 8A:
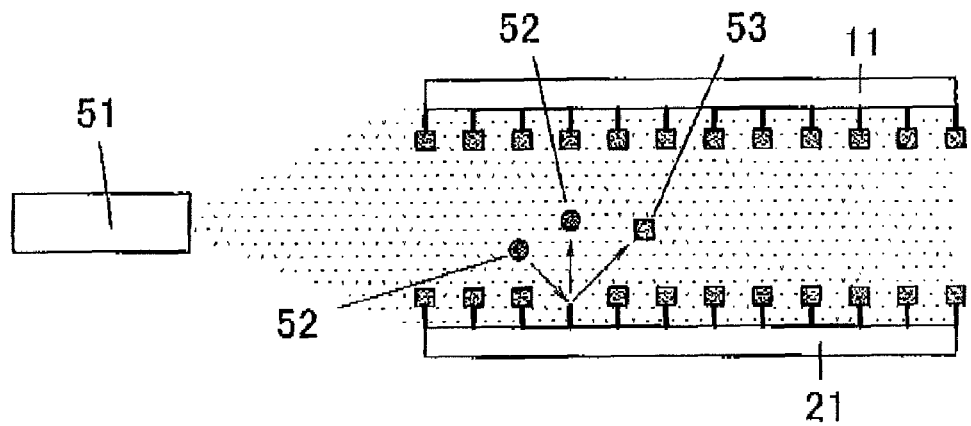
FIGS. 8A to 8C show schematic views for describing steps to be carried out for bonding wafers at a normal temperature.
Figure 8B:
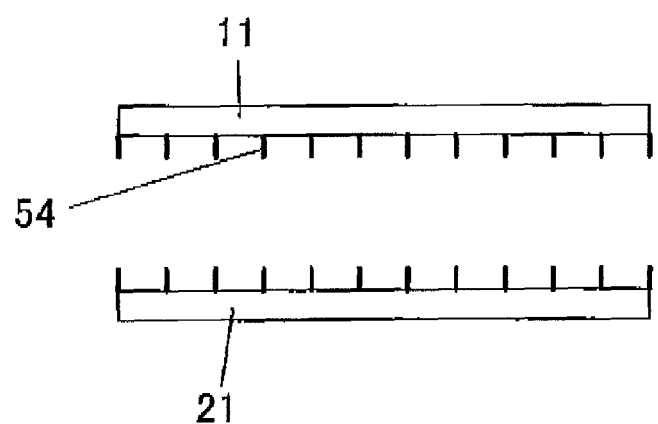
Figure 8C:
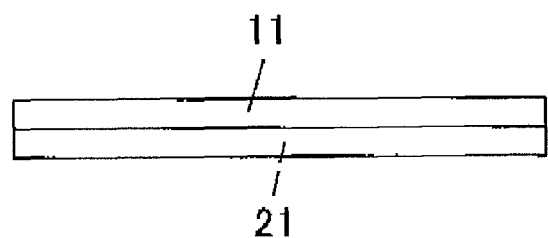

Temperature in raw material chamber: about 50° C.
Pressure for film formation: 1-10 Torr
Temperature for film formation: 200-500° C.
Plasma power: about 400 W
Distance to susceptor: 5-20 mm In the manufacturing process described above, the wafers each having the TEOS-SiO$_2$ film formed thereon are bonded by the direct bonding or the like. This bonding method called direct bonding is implemented in accordance with a principle shown in FIGS. 8A to 8C. First, the wafers 11 and 21 to be bonded are put into a chamber of a bonding device. Herein, the chamber is kept at a normal temperature, and a degree of vacuum (i.e., a degree of vacuum prior to activation) in the chamber is set at a high vacuum of about $1.0 \times 10^{-5}$ Pa. As shown in FIG. 8A, when an ion gun 51 emits Ar$^+$ ions 52 toward the wafers in the chamber, the Ar$^+$ ions 52 are sputtered to flick SiO$_2$ molecules 53. As shown in FIG. 8B, by the emission of the Ar$^+$ ions 52 for one to 10 minute(s), the SiO$_2$ molecules 53 are blown off and bond lines 54 are exposed in the entire bonding surface, so that the surfaces (the bonding surfaces) of the wafers 11 and 21 are activated. The TEOS-SiO$_2$ film is excellent in surface smoothness as will be described later and therefore allows even activation on the surface of the wafer. As shown in FIG. 8C, the activated bonding surfaces can be bonded firmly at a normal temperature without an adhesive resin or the like being interposed therebetween.

In the description of the principle shown in FIGS. 8A to 8C, the joining surfaces each having the TEOS-SiO$_2$ film formed thereon are subjected to the direct bonding. Alternatively, a TEOS-SiO$_2$ film (e.g., the insulating seal 13) formed on a bonding surface of a first wafer and an Si wafer surface bared on a bonding surface of a second wafer may be subjected to the direct bonding (in a case where only one of the two bonding surfaces is activated) as in the manufacturing process shown in FIG. 5. In a case where one of the wafers is simply a wafer for sealing having no device formed thereon, an SiO$_2$ film may be formed on a bonding surface of such a wafer for sealing by thermal oxidation. Alternatively, an SiO$_2$ film formed by sputtering may be smoothed by polishing (e.g., CMP).

Hereinabove, the bonding method according to one embodiment of the present invention is described. According to this method, it is possible to obtain an insulating film for bonding which has satisfactory surface smoothness and thickness evenness. That is, according to a method for forming a TEOS-SiO$_2$ film by a CVD method, it is possible to obtain an SiO$_2$ film having satisfactory surface smoothness and thickness evenness by a film forming process at a relatively low temperature.

Herein, the relatively low temperature refers to a temperature to prevent damage to devices (e.g., IC devices) and wiring patterns provided on a wafer. In a case of using Cu wires, for example, the relatively low temperature is not more than 500° C. In a case of using Al wires, moreover, the relatively low temperature is not more than 400° C.

Table 1 to be described below provides a result of comparison regarding surface smoothness, thickness evenness and a temperature in a film forming process among a TEOS-SiO$_2$ film formed by a CVD method, an SiO$_2$ film formed by a thermal oxidation method and an SiO$_2$ film formed by a sputtering method.

TABLE 1

|  | CVD method (TEOS) | Thermal oxidation method | Sputtering method |
| --- | --- | --- | --- |
| Surface smoothness | Excellent | Excellent | Bad |
| Thickness evenness | Excellent | Excellent | Bad |
| Process temperature | Good | Incapable | Excellent |

Figure 9:
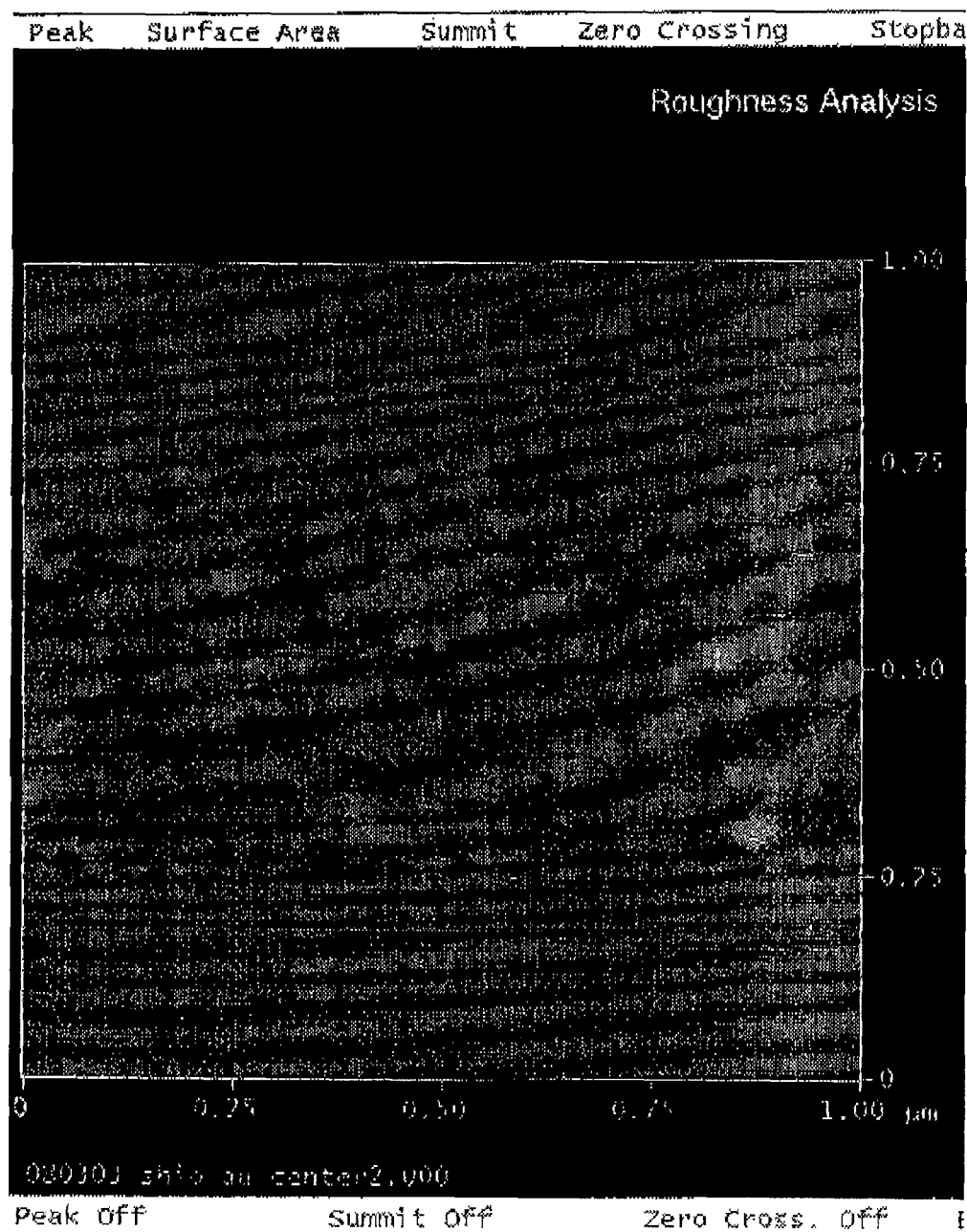
FIG. 9 shows a TEOS-SiO₂ film observed with a microscope.
Figure 10:
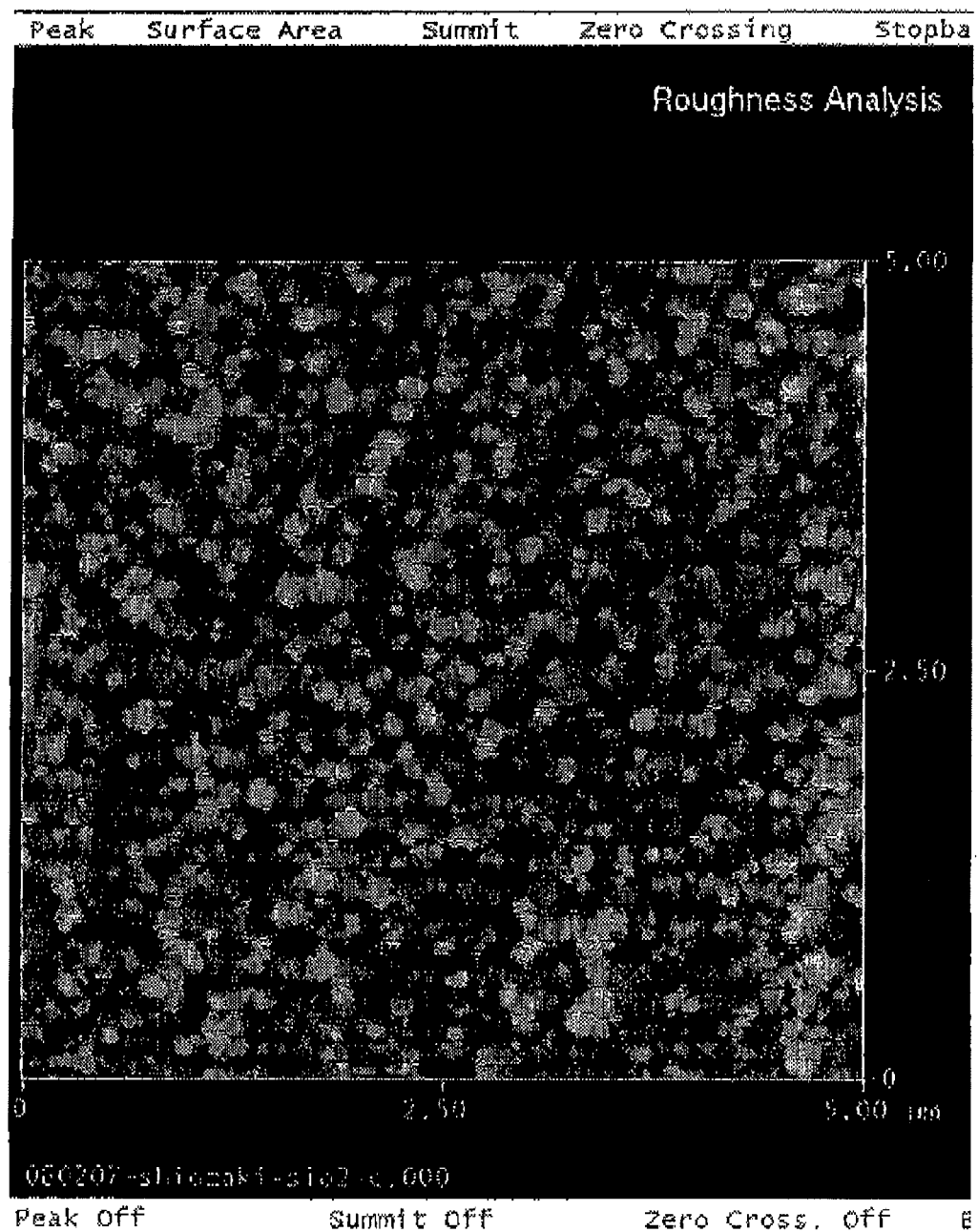
FIG. 10 shows an SiO₂ film formed by sputtering and observed with the microscope.

FIG. 9 shows an enlarged microscopic photograph of the TEOS-SiO$_2$ film formed by the CVD method. FIG. 10 shows an enlarged microscopic photograph of the SiO$_2$ film formed by the sputtering method.

As can be observed from FIG. 10, in the sputtering method, surface roughness is considerably large, and an average surface roughness Ra is 3.7 nm whereas a maximum level difference Rmax is 34.3 nm. In order to bond wafers by direct bonding, desirably, the average surface roughness is not more than 1 nm whereas the maximum level difference is not more than 10 nm. For this reason, the SiO$_2$ film formed by the sputtering method must be subjected to polishing for smoothing a surface of the SiO$_2$ film. However, the sputtering method can not be used because the wafer can not be polished in view of presence of structural components such as an MEMS device. In Table 1, therefore, the surface smoothness in the sputtering method was evaluated as "Bad".

As can be observed from FIG. 9, in the CVD method for forming the TEOS-SiO$_2$ film, surface roughness is considerably small, and an average surface roughness Ra is 0.2 nm whereas a maximum level difference Rmax is 5.7 nm. These values satisfy the requirements that the average surface roughness is not more than 1 nm and the maximum level difference is not more than 10 nm. In Table 1, therefore, the surface smoothness in the CVD method for forming the TEOS-SiO$_2$ film was evaluated as "Excellent" as in the thermal oxidation method.

Figure 11:
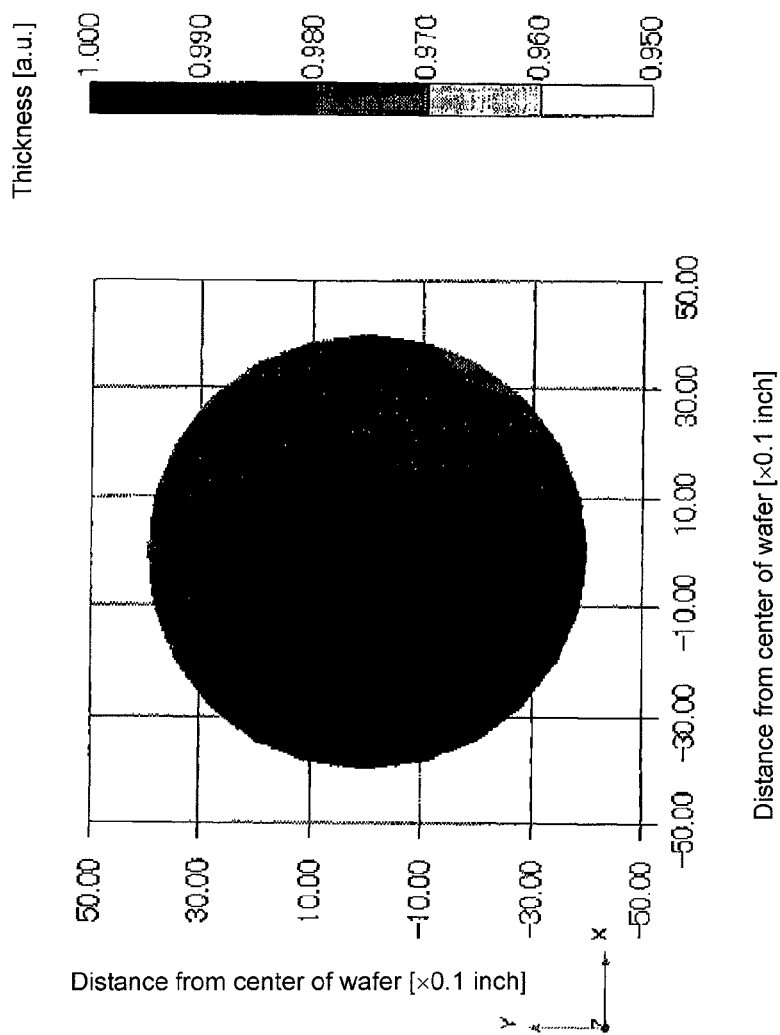
FIG. 11 shows a variation in in-plane thickness of a TEOS-SiO₂ film formed on a wafer.
Figure 12:
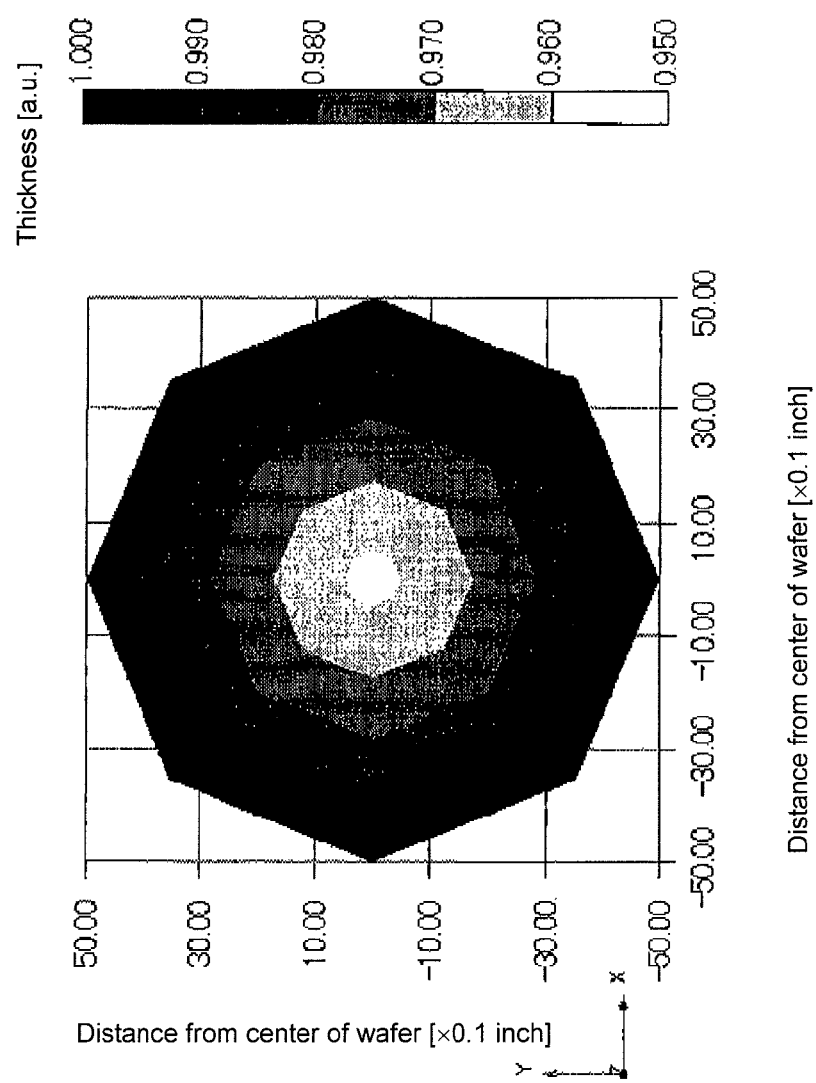
FIG. 12 shows a variation in in-plane thickness of an SiO₂ film formed by sputtering on a wafer.

FIG. 11 shows a variation in in-plane thickness of a TEOS-SiO$_2$ film formed by a CVD method on a wafer having a diameter of eight inches. FIG. 12 shows a variation in in-plane thickness of an SiO$_2$ film formed by sputtering on a wafer having a diameter of eight inches. Each wafer is normalized such that a maximum thickness is 1.000.

As shown in FIG. 12, according to the sputtering method, the variation in in-plane thickness is not less than 5%. In Table 1, therefore, the thickness evenness in the sputtering method was evaluated as "Bad".

As shown in FIG. 11, according to the CVD method for forming the TEOS-SiO$_2$ film, the variation in in-plane thickness is suppressed except a slight portion of an edge and the resultant thickness evenness is considerably favorable. Specifically, the variation in in-plane thickness is not more than 1%. In Table 1, therefore, the thickness evenness in the CVD method for forming the TEOS-SiO$_2$ film was evaluated as "Excellent" as in the thermal oxidation method.

In the sputtering method, moreover, a substrate temperature in a film forming process is about 100° C. which is considerably low. For this reason, there is a considerably low possibility that the wiring pattern and the like are damaged. In Table 1, accordingly, the process temperature in the sputtering method was evaluated as "Excellent".

In the thermal oxidation method, on the other hand, a substrate temperature is about 1000° C. For this reason, there is a high possibility that the wiring pattern and the like are damaged. In Table 1, accordingly, the process temperature in the thermal oxidation method was evaluated as "Incapable".

In the CVD method for forming the TEOS-SiO$_2$ film, a substrate temperature is 200 to 500° C., preferably about 300° C. For this reason, there is no possibility that the wiring pattern and the like are damaged although this temperature is higher than that in the sputtering method. In Table 1, accordingly, the process temperature in the CVD method for forming the TEOS-SiO$_2$ film was evaluated as "Good".

As described above, the wafer level bonding method according to this embodiment allows formation of an insulating film for bonding, which is excellent in surface smoothness and thickness evenness, by a low-temperature process. In the film forming process, the temperature can be set at not more than 500° C., so that a step of manufacturing a MEMS 31 can be carried out as the low-temperature process by combination with direct bonding and the like. In this low-temperature process, wiring patterns made of Al and the like and MEMS structural components are less prone to be damaged. Moreover, use of the direct bonding and the like eliminates necessity of cooling the MEMS 31, leading to improvement of manufacturing efficiency.

The excellent surface smoothness and thickness evenness can be attained since the TEOS-SiO$_2$ film formed by the CVD method is used as the insulating film for bonding. Therefore, excellent bonding strength can be attained when wafers are bonded with this insulating film for bonding being interposed therebetween in a state that insulation between the wafers is maintained. Further, use of this insulating film for bonding improves reliability at the bonded portion. Moreover, the bonding of the wafers also allows attainment of excellent sealability and hermeticity. In addition, the insulating film for bonding is not necessarily polished unlike an insulating film formed by a PVD method such as sputtering, and can be used as deposition, leading to improvement of a degree of freedom concerning the manufacturing process of the MEMS 31.

The foregoing embodiment describes the case of the direct bonding shown in FIGS. 8A to 8C. The bonding method according to this embodiment allows formation of an SiO$_2$ film having satisfactory smoothness and thickness evenness by a low-temperature process. Therefore, plasma bonding may be employed in place of the direct bonding.

Figure 13:
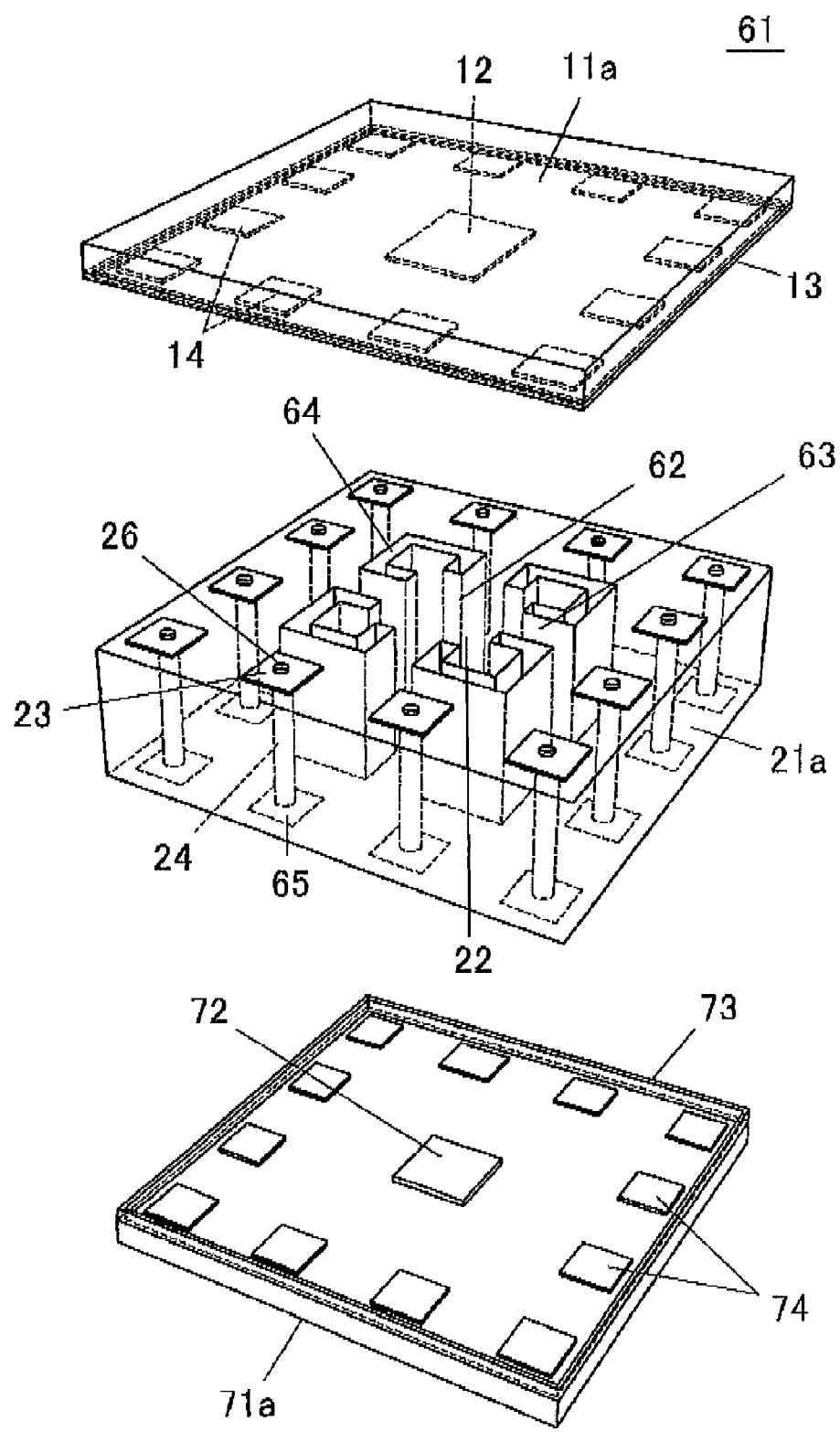
FIG. 13 shows an exploded perspective view of a MEMS according to another embodiment of the present invention.

The foregoing embodiment describes the case where the two wafers are bonded. Alternatively, a plurality (e.g., not less than three) of wafers may be bonded. In a MEMS 61 shown in FIG. 13, for example, a weight 62 is arranged in a through hole 64 penetrating vertically through a substrate 21a and is supported by a bidirectional cantilever 63. In other words, a biaxial acceleration sensor is provided as a MEMS device 22 in the substrate 21a.

Such a MEMS 61 has the through hole 64 which is also opened at a bottom surface thereof. In order to seal the MEMS device 22, a top surface is sealed with a cover substrate 11a and, additionally, the bottom surface must be sealed. Therefore, the bottom surface is sealed with a cover substrate 71a.

The cover substrate 71a is similar in structure to the cover substrate 11a. That is, the cover substrate 71a includes an IC device 72 and an electrode 74. Moreover, a substrate seal 73 (an insulating film for bonding) which is a TEOS-SiO$_2$ film is formed at a periphery of the cover substrate 71a. On a bottom surface of the substrate 21a, an electrode 65 and an Au protruding electrode are formed so as to be opposed to the electrode 74.

The MEMS 61 having the three-layer structure described above is manufactured as in the MEMS having the two-layer structure. More specifically, a wafer 11 having a plurality of IC devices 12 provided thereon and a wafer 21 having a plurality of MEMS devices 22 provided thereon are subjected to direct bonding with an insulating seal 13 being interposed therebetween. Moreover, a wafer having a plurality of IC devices 72 provided thereon (i.e., a host substrate for a cover substrate 71a) and the wafer 21 are also subjected to direct bonding with a substrate seal 73 being interposed therebetween. Thus, the MEMS 61 is obtained by dicing from the three wafers layered as described above.

The foregoing embodiment describes the wafer level bonding (the wafer level packaging) in which substrates in a wafer state are bonded and then are cut. However, one or more embodiments of the present invention is also applicable to bonding at a chip level. For example, the wafer 11 is cut to prepare a plurality of chip-like substrates 11a whereas the wafer 21 is cut to prepare a plurality of chip-like substrates 21a. Thereafter, the chip-like substrates 11a and 21a may be subjected to direct bonding or the like with a TEOS-SiO$_2$ film being interposed therebetween.

What is claimed is:

1. A substrate bonding method comprising:
    a film forming step of forming an insulating film for bonding in such a manner that an SiO$_2$ film made of TEOS is deposited on at least one of a first substrate and a second substrate by a CVD method; and
    a bonding step of bonding the first substrate and the second substrate with the insulating film for bonding being interposed between the first substrate and the second substrate,
    wherein the bonded substrates are cut at a position where the insulating film for bonding is divided.

2. The substrate bonding method according to claim 1, wherein
    an electrode for bonding made of a plastically deformable metal is formed on one of an electrode of the first substrate and an electrode of the second substrate, and
    in the bonding step, the first and second substrates are layered and bonded in such a manner that the electrode for bonding is abutted against the electrode of the substrate on which the electrode for bonding is not formed, before the insulating film for bonding is abutted against a surface of the substrate on which the insulating film for bonding is not formed, and then is press-fitted to the electrode of the substrate on which the electrode for bonding is not formed.

3. The substrate bonding method according to claim 1, wherein in the bonding step, the first substrate and the second substrate are bonded with the insulating film for bonding being interposed therebetween by a bonding method for activating a bonding surface.

4. The substrate bonding method according to claim 1, wherein the first substrate is a wafer substrate, the second substrate is a wafer substrate comprising at least one devices provided thereon, and the first substrate and the second substrate are bonded and then are cut for each region where the at least one device is provided.

5. The substrate bonding method according to claim 1, wherein the bonded substrates are cut at a position between adjacent insulating films for bonding.

6. The substrate bonding method according to claim 1, wherein the number of substrates to be bonded is not less than three.

* * * * *